(12) United States Patent  
Briere

(10) Patent No.: US 8,729,644 B2  
(45) Date of Patent: May 20, 2014

(54) PROGRAMMABLE III-NITRIDE SEMICONDUCTOR DEVICE

(71) Applicant: International Rectifier Corporation, El Segundo, CA (US)

(72) Inventor: Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/906,098

(22) Filed: May 30, 2013

(65) Prior Publication Data

US 2013/0256694 A1 Oct. 3, 2013

Related U.S. Application Data

(63) Continuation of application No. 13/472,258, filed on May 15, 2012, now Pat. No. 8,455,922, which is a continuation of application No. 11/460,725, filed on Jul. 28, 2006, now Pat. No. 8,183,595.

(60) Provisional application No. 60/703,931, filed on Jul. 29, 2005.

(51) Int. Cl.  
    *H01L 21/02* (2006.01)

(52) U.S. Cl.  
    USPC ........... 257/405; 257/183; 257/194; 257/402; 257/E29.246; 257/E29.212

(58) Field of Classification Search  
    CPC ............ H01L 29/778; H01L 29/66431; H01L 29/7786  
    USPC .................. 257/183, 192, 194, 288, 402, 405, 257/E29.246, E29.212, E29.213, E29.214  
    See application file for complete search history.

(56) References Cited

U.S. PATENT DOCUMENTS

| | | | | |
|---|---|---|---|---|
| 8,084,785 B2 * | 12/2011 | Briere | ............................ | 257/194 |
| 8,183,595 B2 * | 5/2012 | Briere | ............................ | 257/194 |
| 2007/0026587 A1 | 2/2007 | Briere | | |

\* cited by examiner

*Primary Examiner* — Eduardo A Rodela  
(74) *Attorney, Agent, or Firm* — Farjami & Farjami LLP

(57) ABSTRACT

A III-nitride semiconductor device which includes a charged gate insulation body.

20 Claims, 2 Drawing Sheets

PROGRAMMABLE III-NITRIDE SEMICONDUCTOR DEVICE

This is a continuation of application Ser. No. 13/472,258 filed May 15, 2012.

RELATED APPLICATION

This application is based on and claims the benefit of U.S. Provisional Application Ser. No. 60/703,931, filed on Jul. 29, 2005, entitled NORMALLY OFF III-NITRIDE SEMICONDUCTOR DEVICE HAVING A PROGRAMMABLE GATE, to which a claim of priority is hereby made and the disclosure of which is incorporated by reference.

FIELD OF THE INVENTION

The present application relates to power semiconductor devices, and more particularly to III-nitride power semiconductor devices.

DEFINITION

As referred to herein a III-nitride semiconductor refers to a semiconductor alloy from the InAlGaN system, including, but not limited to, GaN, AlGaN, AlN, InGaN, InAlGaN, and the like.

BACKGROUND OF THE INVENTION

A conventional III-nitride heterojunction power semiconductor device includes one III-nitride semiconductor body of one band gap disposed over another III-nitride semiconductor body of another band gap to form a two dimensional electron gas that serves as a conduction channel between the power electrodes of the device. III-nitride heterojunction power semiconductor devices are commercially desirable because of their high band gap and high current carrying capabilities. However, a typical III-nitride power semiconductor device is normally ON. Generally speaking, a normally ON power semiconductor device is less desirable in that it requires additional circuitry to keep its channel open in order to render the same OFF.

It is, therefore, desirable to have a normally off III-nitride power semiconductor device.

SUMMARY OF THE INVENTION

A semiconductor device according to the present invention includes a first III-nitride semiconductor body having a band gap, a second III-nitride semiconductor body having another band gap over the first III-nitride semiconductor body to form a III-nitride heterojunction having a two dimensional electron gas, a first power electrode coupled to the second III-nitride semiconductor body, a second power electrode coupled to the second III-nitride semiconductor body, a gate insulation body having charge (e.g. negative charge) trapped in the body thereof over the second III-nitride semiconductor body, and a gate electrode disposed over the gate insulation body.

According to one aspect of the present invention the charge in the gate insulation body is selected to interrupt the two dimensional electron gas.

According to another aspect of the present invention the charge in the gate insulation body can be varied to obtain a desired threshold voltage.

In a device according to the present invention, first III-nitride semiconductor body is comprised of one semiconductor alloy from the InAlGaN system, e.g., preferably, GaN, and the second III-nitride semiconductor body is comprised of another semiconductor alloy from the InAlGaN system, e.g., preferably, AlGaN.

According to an aspect of the present invention, gate insulation body includes at least one gate insulation body, e.g., preferably, $Si_3N_4$, disposed adjacent another, different insulation body, e.g., preferably, $SiO_2$. The present invention, however, is not limited to two insulation bodies, rather, the gate insulation body can include any number of alternately arranged first and second insulation bodies.

A semiconductor device according to the present invention may be formed as a discrete device over a substrate such as a silicon substrate, a silicon carbide substrate, or a sapphire substrate; or it may be formed as part of an integrated circuit alongside other elements in a common semiconductor body.

A device according to the present invention can be fabricated by disposing one III-nitride semiconductor body having one band gap over another III-nitride semiconductor body of another band gap to obtain a two dimensional electron gas, coupling a first and a second power electrode to the second III-nitride semiconductor body, forming a charged gate insulation body (e.g., preferably, negatively charged) over the second III-nitride semiconductor body, and forming a gate electrode over the charged gate insulation body.

A gate insulation body according to the present invention can be formed by forming one insulation body over another insulation body, and applying a bias to the gate electrode while heating the gate insulation body.

Alternatively, but not necessarily, the gate insulation body according to the present invention can be formed by forming a charged one insulation body adjacent another insulation body, and then heating the gate insulation body.

A gate insulation body can also be formed by forming one insulation body adjacent another insulation body, and implanting dopants into at least one of the insulation bodies. This may be followed by heating the gate insulation body if desired. The dopant species can be any one or a combination of Fluorine, Bromine, Iodine, and Chlorine atoms, for example. Note that any one of these techniques allows for adjusting the threshold voltage of the gate, and thus allows the gate to be programmable.

Other features and advantages of the present invention will become apparent from the following description of the invention which refers to the accompanying drawings.

DETAILED DESCRIPTION OF THE FIGURES

Figure 1:
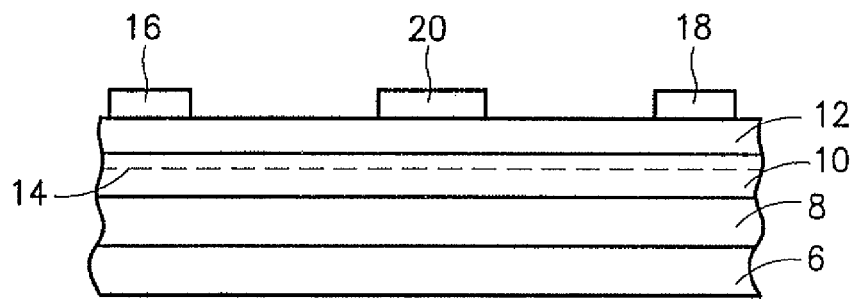
FIG. 1 schematically shows a cross-sectional view of the active region of a III-nitride power semiconductor device according to the prior art.

FIG. 1 illustrates an example of a typical III-nitride heterojunction high electron mobility transistor (HEMT). Specifically, a HEMT according to the prior art includes a first III-nitride semiconductor body 10 having one band gap, which may be composed of, for example, GaN, and a second III-nitride semiconductor body 12 having another band gap, which may be composed of, for example, AlGaN, disposed over first semiconductor body 10. First semiconductor body 10 may be formed over a transition body 8 composed, for example, of AlN, which is itself formed over substrate 6. As is known, transition body 8 could be a series of layers including GaN, AlGaN, AlN, InGaAlN in various orders, to relieve stress due to the mismatch of a hetero-epitaxial layer with a substrate. Substrate 6 is preferably formed from Si, but may be formed from SiC, Sapphire, or the like. Alternatively, substrate 6 may be formed from a bulk III-nitride semiconductor (e.g. bulk GaN) which is compatible with first semiconductor body 10, in which case transition body 8 may be eliminated.

As is well known, the heterojunction of first III-nitride semiconductor body 10 and second III-nitride semiconductor body 12 results in the formation of a conductive region usually referred to as a two dimensional electron gas or 2DEG 14. Current may be conducted between a first power electrode 16 (which is preferably ohmically coupled to second semiconductor body 12), and second power electrode 18 (which is preferably also ohmically coupled to second semiconductor body 12) through 2DEG 14.

A conventional HEMT, such as the one seen in FIG. 1, is a normally ON device. In many applications it is desirable to have a normally OFF device. Thus, a gate structure 20 may be disposed between first power electrode 16 and second power electrode 18. Gate structure 20 includes at least a gate electrode which may be electrically insulated by a gate insulation and thus capacitively couple to second III-nitride semiconductor body 12. The application of an appropriate voltage to the gate electrode of gate structure 20 causes the interruption of 2DEG 14 thereby turning the device OFF.

Figure 2:
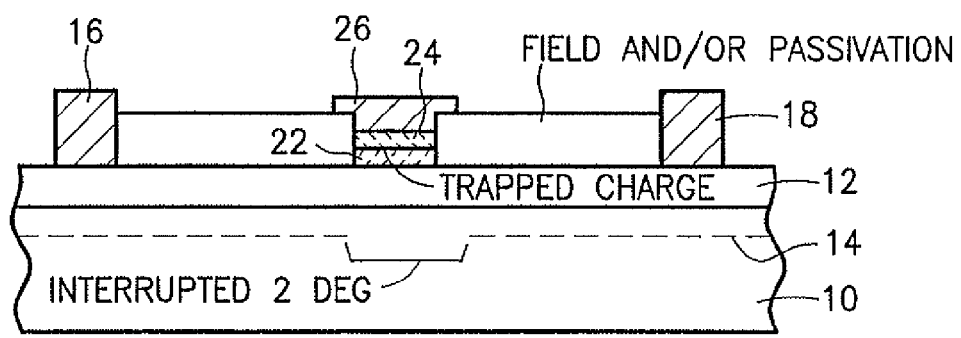
FIG. 2 schematically shows a cross-sectional view of the active region of a III-nitride heterojunction power device according to the first embodiment of the present invention.

Referring to FIG. 2, in which like numerals identify like features, a device according to the first embodiment of the present invention includes a gate structure having first insulation body 22 disposed over a portion second III-nitride semiconductor body 12, second insulation body 24 disposed on first insulation body 22, and gate electrode 26. A field or passivation layer 27 is provided as shown. According to the present invention first insulation body 22 and second insulation body 24 are selected in order to create a charge trap. That is, charge can be trapped between first insulation body 22 and second insulation body 24.

For example, first insulation body 22 can be $Si_3N_4$ and second insulation body 24 can be $SiO_2$. Or, first insulation body 22 can be composed of $SiO_2$ and second insulation body 24 may be composed of $Si_3N_4$.

In a device according to the present invention, negative charge is trapped between first insulation body 22 and second insulation body 24. The amount of trapped charge can be selected so that 2DEG below gate electrode 26 is interrupted, thereby rendering the device normally OFF. An application of an appropriate voltage can then restore 2DEG 14 and render the device ON. Thus, a normally OFF switchable device can be obtained.

In order to trap the negative charge, after the fabrication of the device (according to any known method), a bias is applied to gate electrode 26 to generate the negative charge. This will cause a current to flow through the insulator (eg, through a tunneling mechanism), upon the application of a sufficiently high applied electric field. As a further feature of the invention, this effect may be enhanced if the bias is applied, while the device is heated. The application of heat generates the charge which is trapped between the first insulation body 22 and second insulation body 24. Temperature, the applied voltage and time affect how much charge is generated and trapped.

Alternatively, at least one insulation body can be grown with negative charge and then heated to allow the charge to migrate and become trapped between the two insulation bodies. Thus, for example, $Si_3N_4$ can be grown with negative charge for this purpose.

As another alternative, Fluorine, Bromine, Iodine, Chlorine, or the like atoms may be implanted in at least one of the insulation bodies, followed by the application of heat in order to allow charge to migrate to the interface of the insulation bodies.

In addition to being a normally OFF device, a device according to the present invention is capable of being programmed to have a variety of desirable threshold voltage. That is, the threshold voltage of a device according to the present invention can be varied by the selection of the appropriate amount of charge.

Furthermore, instead of only two insulation bodies multiple insulation bodies can be stacked in order to reach the desired threshold voltage. Thus, a device according to the present invention can include under gate electrode 26 thereof any one or a combination of the following:
$SiO_2/Si_3N_4$;
$SiO_2/Si_3N_4/SiO_2$;
$SiO_2/Si_3N_4/SiO_2/Si_3N_4$;
$Si_3N_4/SiO_2$;
$Si_3N_4/SiO_2/Si_3N_4$;
$Si_3N_4/SiO_2/Si_3N_4/SiO_2$; and any combination of the above.

It should be understood that a device according to the present invention may be formed over a substrate in any known manner (e.g. over a transition body 8 formed on a substrate 10) as a discrete power device, or may be formed with other devices on a common substrate as a part of an integrated circuit.

Figure 3:
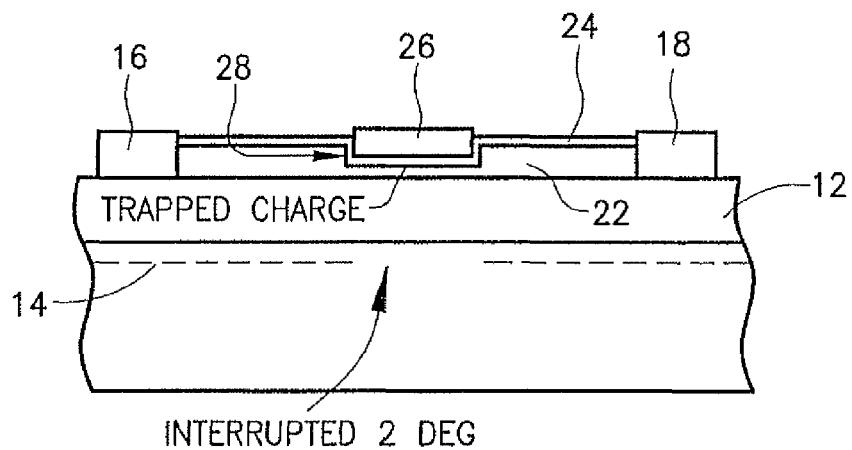
FIG. 3 schematically shows a cross-sectional view of the active region of a III-nitride heterojunction power device according to the second embodiment of the present invention.

Referring now to FIG. 3, in a device according to the second embodiment of the present invention, first insulation body 22 includes a recess 28, second insulation body 24 is formed over at least the bottom and the sidewalls of recess 28, and gate electrode 26 may be formed at least inside recess 28 over second insulation body 24. According to the present invention, charge is trapped between first insulation body 22 and second insulation body 24, preferably along the bottom and the sidewalls of recess 28. As a result, the area devoted to charge entrapment is increased without increasing the lateral area covered by the gate structure.

Figure 4:
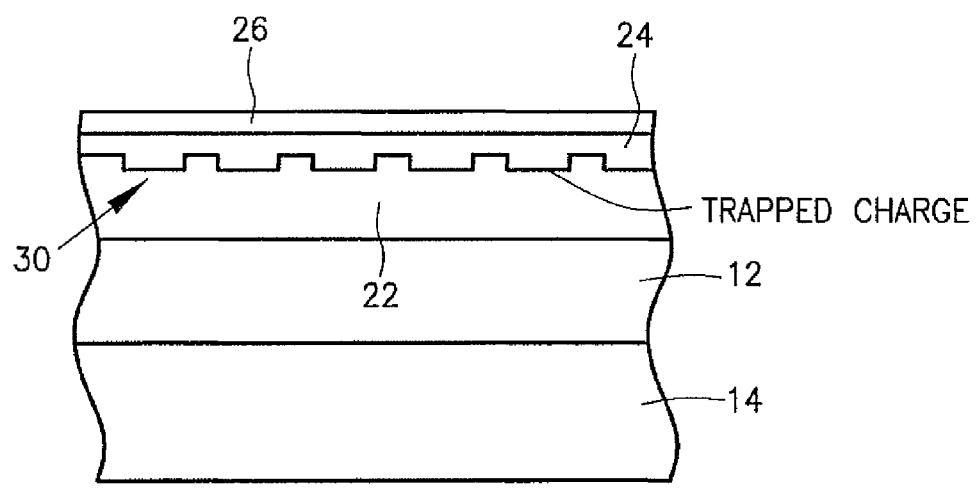
FIG. 4 schematically shows a cross-sectional view of a portion of the gate structure of a III-nitride heterojunction power device according to the third embodiment of the present invention.

Referring next to FIG. 4, in a device according to the third embodiment of the present invention, a plurality of spaced recesses 30 are formed in first insulation body 22 instead of only one in order to further increase the interface area between first insulation body 22 and second insulation body 24, and thus allow for a larger charge trapping capacity between the two bodies.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A III-nitride semiconductor device comprising:
a first III-nitride semiconductor body comprising GaN;
a second III-nitride semiconductor body comprising AlGaN and disposed over said first III-nitride semiconductor body to form a two dimensional electron gas;

first and second power electrodes coupled to said second III-nitride semiconductor body;

a gate electrode electrically insulated by a gate insulation body from said second III-nitride semiconductor body, wherein said gate insulation body comprises only one insulation body, and wherein a charge is trapped within said only one insulation body, said charge adjusting a threshold voltage of said III-nitride semiconductor device.

2. The III-nitride semiconductor device of claim 1, wherein said threshold voltage is adjusted so as to cause said III-nitride semiconductor device to be normally OFF.

3. The III-nitride semiconductor device of claim 1, wherein said only one insulation body comprises silicon dioxide.

4. The III-nitride semiconductor device of claim 1, wherein said only one insulation body comprises silicon nitride.

5. The III-nitride semiconductor device of claim 1, wherein said only one insulation body comprises a recess.

6. The III-nitride semiconductor device of claim 1, wherein said charge is formed by a dopant selected from the group consisting of Fluorine, Chlorine, Bromine, and Iodine.

7. The III-nitride semiconductor device of claim 1, wherein said charge is formed by a combination of dopants, wherein said dopants are selected from the group consisting of Fluorine, Chlorine, Bromine, and Iodine.

8. A III-nitride semiconductor device comprising:

a first III-nitride semiconductor body comprising GaN;

a second III-nitride semiconductor body comprising AlGaN and disposed over said first III-nitride semiconductor body to form a two dimensional electron gas;

first and second power electrodes coupled to said second III-nitride semiconductor body;

a gate electrode electrically insulated by a gate insulation body from said second III-nitride semiconductor body, wherein said gate insulation body comprises only one insulation body, and wherein a charge is trapped between said only one insulation body and said second III-nitride semiconductor body, said charge adjusting a threshold voltage of said III-nitride semiconductor device.

9. The III-nitride semiconductor device of claim 8, wherein said threshold voltage is adjusted so as to cause said III-nitride semiconductor device to be normally OFF.

10. The III-nitride semiconductor device of claim 8, wherein said only one insulation body comprises silicon dioxide.

11. The III-nitride semiconductor device of claim 8, wherein said only one insulation body comprises silicon nitride.

12. The III-nitride semiconductor device of claim 8, wherein said only one insulation body comprises a recess.

13. The III-nitride semiconductor device of claim 8, wherein said charge is formed by a dopant selected from the group consisting of Fluorine, Chlorine, Bromine, and Iodine.

14. The III-nitride semiconductor device of claim 8, wherein said charge is formed by a combination of dopants, wherein said dopants are selected from the group consisting of Fluorine, Chlorine, Bromine, and Iodine.

15. A III-nitride semiconductor device comprising:

a first III-nitride semiconductor body comprising GaN;

a second III-nitride semiconductor body comprising AlGaN and disposed over said first III-nitride semiconductor body to form a two dimensional electron gas;

first and second power electrodes coupled to said second III-nitride semiconductor body;

a gate electrode electrically insulated by a gate insulation body from said second III-nitride semiconductor body, wherein said gate insulation body comprises only one insulation body, and wherein a charge is trapped between said only one insulation body and said gate electrode, said charge adjusting a threshold voltage of said III-nitride semiconductor device.

16. The III-nitride semiconductor device of claim 15, wherein said threshold voltage is adjusted so as to cause said III-nitride semiconductor device to be normally OFF.

17. The III-nitride semiconductor device of claim 15, wherein said only one insulation body comprises silicon dioxide.

18. The III-nitride semiconductor device of claim 15, wherein said only one insulation body comprises silicon nitride.

19. The III-nitride semiconductor device of claim 15, wherein said charge is formed by a dopant selected from the group consisting of Fluorine, Chlorine, Bromine, and Iodine.

20. The III-nitride semiconductor device of claim 15, wherein said charge is formed by a combination of dopants, wherein said dopants are selected from the group consisting of Fluorine, Chlorine, Bromine, and Iodine.

* * * * *